United States Patent [19]
Diffenderfer

[11] Patent Number: 5,731,744
[45] Date of Patent: Mar. 24, 1998

[54] VOLTAGE CONTROLLED OSCILLATOR

[75] Inventor: Jan C. Diffenderfer, San Diego, Calif.

[73] Assignee: Brooktree Corporation, San Diego, Calif.

[21] Appl. No.: 654,054

[22] Filed: May 28, 1996

[51] Int. Cl.$^6$ ............................................. H03J 5/14
[52] U.S. Cl. .................. 331/158; 331/116 R; 331/116 FE; 331/177 R
[58] Field of Search .......................... 331/177 R, 116 R, 331/158, 116 FE

[56] References Cited

U.S. PATENT DOCUMENTS

| | | | |
|---|---|---|---|
| 4,733,200 | 3/1988 | Ecklund et al. | 331/116 R |
| 4,888,567 | 12/1989 | Berger et al. | 331/116 R |
| 5,126,697 | 6/1992 | Nauta et al. | 331/177 R |

Primary Examiner—Timothy P. Callahan
Assistant Examiner—An T. Luu
Attorney, Agent, or Firm—William C. Cray; Susie H. Oh

[57] ABSTRACT

An apparatus and a method are provided to obtain oscillations from a crystal at a particular frequency by introducing real and imaginary components of voltage to the crystal. The imaginary component of voltage is different from the real component of voltage by a particular phase angle such as 90°. The voltage introduced to the crystal is processed to produce a first current having characteristics corresponding to such voltage and to produce a second current having characteristics related to the imaginary component of such voltage. The first and second currents are combined to produce a first current corresponding to the real component of the voltage introduced to the crystal. This current is shifted through a phase angle of 90° to produce a second current corresponding to the imaginary component of the voltage introduced to the crystal. The first current is converted to a first voltage which is regulated to provide a particular gain. This regulated voltage corresponds to the real component of the voltage introduced to the crystal. The second current is converted to a second voltage which can be adjusted to adjust the frequency of the oscillations from the oscillator. The second voltage corresponds to the imaginary component of the voltage introduced to the crystal. The first and second voltages are combined to produce the voltage for introduction to the crystal.

36 Claims, 1 Drawing Sheet

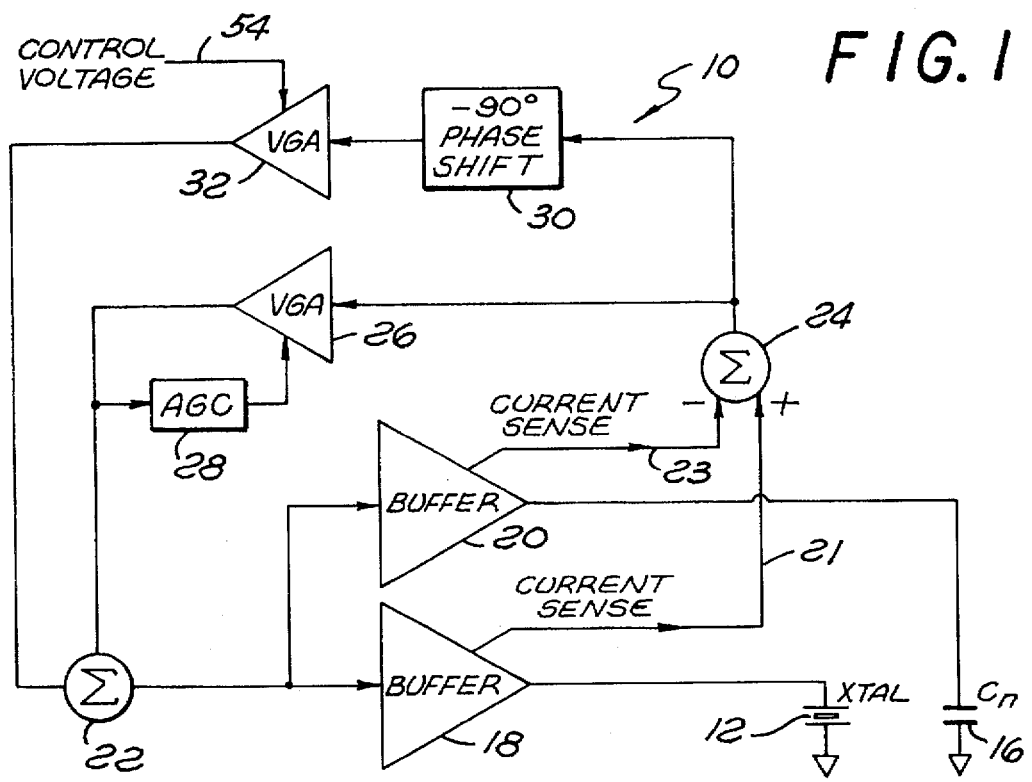
FIG. 1
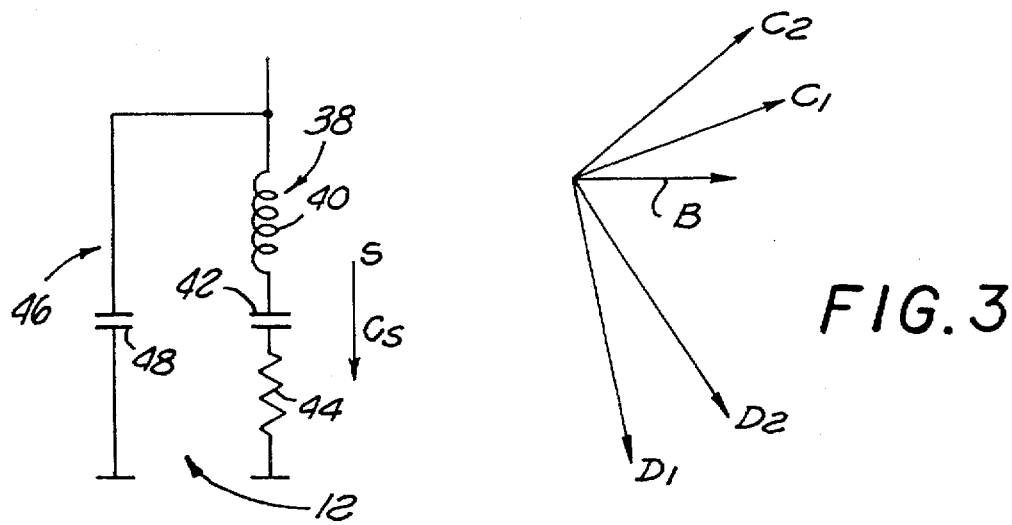
FIG. 2
FIG. 3
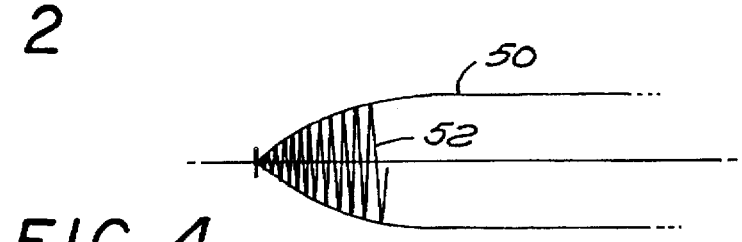
FIG. 4

VOLTAGE CONTROLLED OSCILLATOR

This invention relates to a voltage controlled oscillator. More particularly, the invention relates to a voltage controlled oscillator in which the frequency of oscillations is more precisely controlled and regulated than the voltage controlled oscillators of the prior art. The invention also relates to a method of providing voltage controlled oscillations.

BACKGROUND OF INVENTION

Voltage controlled oscillators have been used for a long period of time. Voltage controlled oscillators generally include a crystal constructed to oscillate in a particular range of frequencies. The frequency of the oscillations is controlled by applying a voltage of a particular magnitude to electrical circuitry including the crystal. The frequency of oscillations can be adjusted by varying the magnitude of the voltage applied to such electrical circuitry.

A crystal can be considered to have two (2) different branches in parallel. One branch involves a series resonant circuit in the crystal. This resonant circuit causes the crystal to resonate in the particular range of frequencies. This branch may be considered to provide a capacitance, an inductance and a resistance in series. The second branch may be considered to involve a capacitance. This capacitance is produced between the two (2) plates to which external connections in the crystal are made. The phase of the first branch involving the resonant circuit has a phase displacement of 90° in a trailing direction relative to the phase of the second branch. The two (2) branches defining a crystal as discussed in the previous paragraph have been known for some time.

A varactor diode employed as a variable capacitance provides one way in the prior art for producing a voltage to vary the frequency of a crystal oscillator. The effect of the capacitance is to vary the capacitance so as to tune the crystal in the oscillator by varying the load capacitance in the oscillator. This type of control does not lend itself to integration and it does not facilitate a fast control for varying the oscillator frequency. The pull range of frequency variations in this type of control is also limited. Furthermore, large auxiliary supply voltages (i.e. 24 volts) are often required.

U.S. Pat. No. 4,646,033 issued on Feb. 24, 1987, to Geoffry W. Perkins for a "Crystal Controlled Oscillator" may be of interest as prior art. This patent describes an oscillation sustaining loop and a diversion gate to introduce a phase shift to the oscillators. However, the oscillator is disadvantageous in that it has long transient characteristics. There is also a significant shift in drive level in the oscillator from one and of the pull range for varying oscillator frequency to the other end of the pull range. The pull range for varying the oscillator frequency is also relatively limited.

Another controllable crystal oscillator involves a switched capacitor implementation. This arrangement involves the use of transmitter switches to control the introduction of lumped values of capacitance into the oscillator circuit. The switched capacitor implementation has significant limitations. For example, it has a discrete, rather than continuous, operating range of frequencies, transient problems and a limited pull range.

A considerable amount of effort has been devoted, and a significant amount of money has been expended, in the past decades to develop and perfect voltage controlled oscillators. This has resulted from the widespread use of such oscillators in electronic circuits. However, no one prior to applicant has addressed the separate branches in the crystal. Furthermore, no one in the prior art has provided a voltage controlled oscillator in which the frequency of oscillations can be regulated as precisely, and over as wide a range of frequencies, as the regulation provided by the voltage controlled oscillator of this invention.

BRIEF DESCRIPTION OF INVENTION

This invention provides a system for and a method of controlling and regulating the frequency of oscillations, of a crystal in a voltage controlled oscillator by providing separate voltages in a particular phase relationship to the two (2) branches (a resonant branch and a capacitive branch) defining the electrical characteristics of the crystal. In the subsequent discussion, the resonant branch is defined as providing a real signal component and the capacitive branch is defined as providing an imaginary signal component.

An apparatus and a method are provided to obtain oscillations from a crystal at a particular frequency by introducing real and imaginary components of voltage to the crystal. The imaginary component of voltage is different from the real component of voltage by a particular phase angle such as 90°. The voltage introduced to the crystal is processed to produce a first current having characteristics corresponding to such voltage and to produce a second current having characteristics related to the imaginary component of such voltage.

The first and second currents are combined to produce a current corresponding to the real component of the voltage introduced to the crystal. This current is shifted through a phase angle of 90° to produce the imaginary component of the voltage introduced to the crystal. The first current is converted to a first voltage which is regulated to provide a particular gain. This regulated voltage corresponds to the real component of the voltage introduced to the crystal. The second current is converted to a second voltage which can be adjusted to adjust the frequency of the oscillations from the oscillator. The second voltage corresponds to the imaginary component of the voltage introduced to the crystal. The first and second voltages are combined to produce the voltage for introduction to the crystal.

The voltage controlled oscillator described above has certain important advantages. It provides an adjustable control to select the frequency of oscillations in the oscillator and it regulates the oscillations at the selected frequency. It provides the frequency selection and regulation in a relatively simple and straight forward manner. It also provides this frequency selection and regulation with a minimal loss of power.

BRIEF DESCRIPTION OF DRAWINGS

In the drawings:

FIG. 1 is a circuit diagram, partly in block form, of a voltage controlled oscillator which includes a crystal and which constitutes one (1) embodiment of the invention;

FIG. 2 is a schematic circuit diagram of the circuitry branches which define the crystal shown in FIG. 1;

FIG. 3 is a schematic diagram illustrating the phase relationships of the signals in the circuitry branches shown in FIG. 2; and FIG. 4 is a schematic diagram showing the build-up of signals produced in the oscillator of FIG. 1 when the oscillator becomes operative.

DETAILED DESCRIPTION

In one embodiment of the invention, a voltage controlled oscillator 10 is provided in FIG. 1. The oscillator 10 includes a crystal 12 of the type normally used in a voltage controlled oscillator employing a crystal. One terminal of the crystal 12 is shown as connected to a reference potential such as a ground 14. A capacitor 16 also has one terminal connected to the reference potential such as the ground 16. As will be described subsequently, the capacitance 16 may be considered as providing a value corresponding to the value provided by one of the branches in the crystal. The capacitance 16 is designated as "Cn" in FIG. 1.

The ungrounded terminals of the crystal 12 and the capacitor 16 respectively receive the outputs from a pair of buffers 18 and 20. Input terminals of the buffers 18 and 20 receive the output from a summer 22. Current sense lines 21 and 23 from the buffers 18 and 20 are respectively connected to input terminals of a summer 24. The summers 22 and 24 may be constructed in a conventional manner.

The output from the summer 24 passes to a variable gain amplifier (VGA) 26. The output from the amplifier 26 is introduced to the summer 22 and to an automatic gain control stage 28 having its output introduced to the amplifier 26. The output from the summer 24 also passes to the input to a phase shift stage 30 which is operative to shift the phase of the signals by a suitable angle such as approximately 90°. Preferably this shift is in a lagging direction. This lagging direction is designated by a negative (−) sign in the phase shift stage 30 in FIG. 1. The output terminal of the phase shift stage 30 is common with the input terminal of a variable gain amplifier 32 having its output terminal connected to the summer 22.

The crystal 12 may be considered to have two (2) parallel branches as shown in FIG. 2. One branch generally indicated at 38 may be considered to have an inductance 40, a capacitance 42 and a resistance 44 in a series relationship. The inductance 40 and the capacitance 42 may be considered to resonate in a particular range of frequencies. The branch 38 may be considered to provide a real component of the signal introduced to the crystal 12. The crystal 12 may also be considered to have a second branch generally indicated at 46 and defined by a reactance such as a capacitance 48. The capacitance 48 is formed by the plates of the crystal 12 or by the holders of the crystal plates. The capacitance 48 may be considered to have a value Cn. This value corresponds to the value Cn of the capacitance 16 in FIG. 1.

FIG. 3 indicates the relationship of the signals introduced to the branches 38 and 46. In FIG. 3, a signal designated as C is introduced to the branch 38. A signal designated as D is introduced to the branch 46 and may be in the form of a voltage. The signal D leads the signal C in phase by an angle of 90° when the phase shift provided by the stage 30 is in a leading direction. As indicated in FIG. 3, the signal D may be considered to pull on the signal C to rotate the signal C. This causes the signal C to rotate in a clockwise direction in FIG. 3 so that the signal has a phase C1 at a first instant of time and has a phase C2 at a subsequent instant of time. Since the phase of the signal D is displaced from the signal C and since the signal D rotates in a clockwise direction, the signal D has a phase D1 at the time that the signal C has the phase C1. In like manner, the signal D has a phase D2 at the same time that the signal C has the phase C2.

The buffer 18 in FIG. 1 introduces a voltage to the branches 38 and 46 in the crystal 12 to produce a resonance of the crystal at a particular frequency. The particular frequency is dependent upon the amplitude of the voltage D in FIG. 3. As the amplitude of the voltage D increases, it may be considered to provide a strengthened pull on the signal C to rotate the signal C at an increased frequency. The particular frequency can accordingly be selected by providing a particular amplitude for the signal D. The amplitude of the signal C is regulated at a substantially constant value so that the signal C will rotate in a circle at the particular frequency.

The buffer 18 provides a current on the line 21 to the summer 24. This current has a phase corresponding to the phase of the voltage introduced by the buffer 18 to the crystal 12. This current may be designated as $$i_{21}=i_{cn}+i_s,\qquad(1)$$

where $i_{21}$=the current in the line 21;

$i_s$=the current in the branch 38; and $i_{cn}$=the current in the branch 46.

The buffer 20 provides a voltage to the capacitance 16. This capacitance has a value corresponding to the value of the capacitance 48 in the branch 46. The buffer 20 provides a current on the line 23 with a phase opposite to the phase of the current in the branch 46. The currents in the lines 21 and 23 are summed in the summer 24 to provide a current with a phase corresponding to the phase of the current in the branch 38. This may be seen from the following equation:

$$i_{21}=i_{cn}+i_s-i_{cn}=i_s\qquad(2)$$

As will be seen, the current from the summer 24 is the current which flows through the branch 38.

The current from the summer 24 is introduced to the variable gain amplifier 26. The amplifier 26 converts the current from the summer 24 to a corresponding voltage. The gain of the amplifier 26 is regulated by the automatic gain control (AGC) circuit 28. In this way, the amplitude of the signal C in FIG. 3 is maintained at a substantially constant value. This causes the signal C to rotate at a substantially constant rate in a circle to produce the particular frequency of the oscillator 10. The voltage from the amplifier 26 is introduced to the summer 22.

The current from the summer 24 is also introduced to the phase shifter 30. The phase shifter 30 shifts the phase of the current, preferably in a lagging direction corresponding to the phase of the signal D relative to the phase of the signal C in FIG. 3. The current in the phase shifter 30 is then introduced to the variable gain amplifier 32 which converts the current into a corresponding voltage. The voltage produced by the variable gain amplifier 32 is dependent upon a control voltage introduced to the variable gain amplifier through a line 54.

As will be appreciated, the voltage from the variable gain amplifier 26 represents the voltage (or current) introduced to the branch 38 of the crystal 12 in FIG. 2. In like manner, the voltage from the variable gain amplifier 32 represents the voltage (or current) introduced to the branch 46 of the crystal 12 in FIG. 2. The summer 22 accordingly produces a voltage which indicates the voltage introduced to the crystal 12. This voltage is introduced to the buffer 18 which introduces the voltage to the crystal 12 to energize the crystal. The voltage from the summer 22 is also introduced to the buffer 20 which converts the voltage to the component representing the voltage introduced to the branch 46. This component of the voltage from the buffer 20 is introduced to the capacitor 16.

FIG. 4 shows an envelope 50 which represents the amplitude of the oscillations from the oscillator 10 when the operation of the oscillator is initiated. FIG. 4 also shows the oscillations 52 produced within the envelope 50. As will be seen, the amplitude of the oscillations progressively builds from a zero amplitude. At the beginning of the oscillations, the signal C has an amplitude with a phase schematically indicated at B in FIG. 3. The signal D then progressively shifts the phase of the signal C to the phases C1 and C2 in FIG. 3. During the progressive shifts in the phase of the signal C to the phases C1 and C2, the amplitude of the signal C builds to the substantially constant amplitude represented at C1 and C2 in FIG. 3.

As previously described, the frequency of the oscillatory signals from the oscillator 10 in FIG. 1 can be varied by varying the control voltage on the line 54. The change in the control voltage will produce only a change in the frequency of oscillations, not a change in drive level and no transients, when the current sensed at the summer 24 is in phase with the signal in the branch 38. This shift in frequency will be almost instantaneous and will have a high relationship to the variation in the control voltage on the line 54. Furthermore, the shift in frequency capable of being provided by the variations in the control voltage on the line 54 is considerably greater than any shift in frequency capable of being provided in the prior art.

The oscillator 10 shown in FIG. 1 and described above has certain important advantages. It separates the signals introduced to the crystal 12 into the real and imaginary components and separately processes these components. As a result, applicants are able to provide a sensitive and reliable control over the value of the frequency provided by the oscillator 10. Applicant is able to control the value of the oscillatory frequency by adjusting the magnitude of the signal component D in FIG. 3 by varying the magnitude of the control voltage introduced to the amplifier 26 through the line 54 in FIG. 1.

The oscillator 10 has other important advantages. It isolates the series resonant branch 38 from the capacitance 16 provided by the crystal holder. It sustains a steady and substantially current of oscillation through the series resonant branch 38. It provides a variable voltage in quadrature with the current through the series resonant branch 38. This voltage has a variable amplitude dependent upon the magnitude of the control voltage on the line 54 in FIG. 1.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

I claim:

1. A voltage controlled oscillator for providing signals at a particular frequency, including, a crystal for providing real and imaginary signal components in a first particular phase relationship to each other, first means for providing a signal in a phase representing the real component of the crystal signal, second means for providing the imaginary component of the signal in the particular phase relationship with the real component of the crystal signal, third means for combining the signals from the first and second means to provide a signal having the real and imaginary components for introduction to the crystal, first buffer means for introducing the signal from the third means to the crystal to energize the crystal at the particular frequency and for recovering a portion of the signal from the third means, second buffer means for recovering the imaginary component of the signal from the third means, fourth means for combining portion of the signal recovered by the first buffer means and the imaginary component of the signal recovered by the second buffer means to provide the signal to the first means.

2. A voltage controlled oscillator as set forth in claim 1, including, fifth means operatively coupled to the first means for regulating the gain of the real component of the signal from the first means, the third means being operative to combine the real component of the signals with the regulated gain from the fifth means and the imaginary component of the signal from the second means to provide the signal having the real and imaginary signal components for introduction to the crystal.

3. A voltage controlled oscillator as set forth in claim 1 wherein the second means shifts the phase of the real component of the signal from the first means to obtain the imaginary component of the crystal signal.

4. A voltage controlled oscillator as set forth in claim 1 wherein the second means includes a variable gain amplifier and a phase shifter for shifting the signal from the first means to obtain the particular phase relationship with the signal from the first means and for introducing the phase shifted signal to the variable gain amplifier.

5. A voltage controlled oscillator as set forth in claim 4 wherein the crystal provides the imaginary component of the signal in a direction leading the real component of the signal by a phase angle of 90° and wherein the phase shifter in the second means shifts the phase of the signal from the first means by a phase angle of 90° in the lagging direction.

6. A voltage controlled oscillator as set forth in claim 5, including, fifth means operatively coupled to the first means for regulating the gain of the real component of the signal to the first means, the fourth means being operative to combine the signal components in the first buffer means and the second buffer means to provide the current from the first means.

7. A voltage controlled oscillator as set forth in claim 1 wherein the second means has a variable gain to control the frequency of the oscillations from the voltage controlled oscillator.

8. A voltage controlled oscillator as set forth in claim 6 wherein the gain of the variable gain amplifier is adjustable to control the frequency of the oscillations from the voltage controlled oscillator.

9. A voltage controlled oscillator for providing signals at a particular frequency, including, a crystal for providing real and imaginary components of a signal at the particular frequency, the real and the imaginary components of the signal having a particular phase relationship to each other, first means for providing the real and imaginary components of the signal for introduction to the crystal, second means responsive to the signal from the first means for producing a signal constituting the imaginary component of the signal at the particular frequency, third means responsive to the signals from the first and second means for producing a signal constituting the real component of the signal at the particular frequency, and fourth means responsive to such signal constituting the real component of the signal for providing a shift in the phase of such signal to produce the imaginary component of such signal, the first means being responsive to the signals from the third and fourth means to provide the real and imaginary components of the signal for introduction to the crystal.

10. A voltage controlled oscillator as set forth in claim 9, including, fifth means for regulating the gain of the real component of the signals from the third means, the first means being responsive to the signals from the fourth and fifth means to provide the real and imaginary components of the signal for introduction to the crystal.

11. A voltage controlled oscillator as set forth in claim 9, including, the third means including a summing stage responsive to the signals from the first and second means for summing such signals to produce the real component of the signal at the particular frequency.

12. A voltage controlled oscillator as set forth in claim 9, including, the fourth means including a variable gain amplifier responsive to the imaginary component of the signal produced by the phase shift in the real component of the signal for providing an adjustable gain in such imaginary signal to control the particular frequency.

13. A voltage controlled oscillator as set forth in claim 9, including, the first means including a summing stage for summing the signals from the third and fourth means to provide the real and imaginary components of the signal for introduction to the crystal.

14. A voltage controlled oscillator as set forth in claim 10, including, the first means including a first buffer responsive to the signal from the first means for providing the imaginary component of the signal in the particular phase relationship with the real component of the crystal signal, the first means including a second buffer responsive to the signals from the fourth and fifth means to provide the real and imaginary components of the signal for introduction to the crystal.

15. A voltage controlled oscillator as set forth in claim 9, fifth means for regulating the gain of the real component of the signals from the third means, the first means being responsive to the signals from the first and second buffer means to provide the real and imaginary components of the signal for introduction to the crystal, the third means including a summing stage responsive to the signals from the first and second buffer means for summing such signals to produce the real component of the signal at the particular frequency, the fourth means including a variable gain amplifier responsive to the imaginary component of the signal produced by the phase shift in the real component of the signal at the particular frequency for providing an adjustable gain in such imaginary signal to control the particular frequency.

16. A voltage controlled oscillator for providing oscillatory signals at a particular frequency, including, a crystal for producing real and imaginary components of a signal to produce the oscillatory signals at the particular frequency, first means for providing the real and imaginary components of the signal for introduction to the crystal, second means for recovering the real component of the signal from the first means, third means for operating upon the real component of the signal from the second means to obtain the imaginary component of the signal, fourth means for combining the real and imaginary components of the signal respectively from the second and third means for introduction to the first means, and fifth means for introducing the signal from the first means to the crystal for the production of the oscillations at the particular frequency by the crystal.

17. A voltage controlled oscillator as set forth in claim 16 wherein the real and imaginary components of the signal provided by the crystal constitute real and imaginary components of a voltage and wherein the signal provided by the first means is a voltage and wherein the real component of the signal recovered by the second means is a current and wherein the third means is operative upon the real component of the signal recovered by the second means to provide a component of current corresponding to the imaginary component of the voltage introduced to the crystal.

18. A voltage controlled oscillator as set forth in claim 17 wherein the second means including means for converting to a voltage the current produced by the second means and the third means includes means for converting to a voltage the current produced by the third means and wherein the fourth means combines the voltages from the second third means to produce a voltage for introduction to the first means.

19. A voltage controlled oscillator as set forth in claim 16 wherein the second means includes a variable gain amplifier and includes means for regulating the gain of the variable gain amplifier at a particular value.

20. A voltage controlled oscillator as set forth in claim 16 wherein the third means includes sixth means for shifting real component of the signal from the second means to obtain the second component of the signal.

21. A voltage controlled oscillator as set forth in claim 20 wherein the second means includes a variable gain amplifier and includes means for regulating the gain of the variable gain amplifier at a particular value.

22. A voltage controlled oscillator as set forth in claim 20 wherein the real and imaginary components of the signal provided by the crystal constitute real and imaginary components of a voltage and wherein the signal provided by the first means is a voltage and wherein the real component of the signal recovered by the second means is a current and wherein the third means is operative upon the real component of the signal recovered by the second means to provide a component of current corresponding to the imaginary component of the signal, the second means includes means for converting to a voltage the current produced by the second means and the third means includes means for converting to a voltage the current produced by the third means and wherein the fourth means combines the voltages from the second and third means to produce a voltage for introduction to the first means.

23. A method of providing oscillations at a particular frequency, including the steps of:

providing a crystal resonant at substantially the particular frequency, introducing to the crystal a first voltage having a real component and an imaginary component with a particular phase relationship to the real component, producing a first current having characteristics corresponding to the characteristics of the voltage introduced to the crystal, producing a second current having characteristics corresponding to the imaginary component of the voltage introduced to the crystal, combining the first and second currents to obtain a third current corresponding to the real component of the voltage introduced to the crystal, operating upon the third current to produce a fourth current having the particular phase relationship to the third current, converting the third current to a second voltage having the characteristics of the third current, converting the fourth current to a third voltage having the characteristics of the fourth current, and combining the second and third voltages to obtain the first voltage for introduction to the crystal.

24. A method as set forth in claim 23, including the steps of:

regulating the gain of the first voltage at a particular value to maintain the oscillations at the particular frequency.

25. A method as set forth in claim 23 wherein the imaginary component of the voltage introduced to the crystal leads by a phase angle of 90° the real component of the voltage introduced to the crystal and wherein the second current is produced by shifting the phase of the first current by an angle of 90° in a lagging direction.

26. A method as set forth in claim 23, including the step of:

varying the magnitude of the second voltage to adjust the frequency of the oscillations in the crystal.

27. A method of providing oscillations at a particular frequency, including the steps of:

providing a crystal resonant at substantially the particular frequency, providing a first signal having a real component, providing from the first signal a second signal having an imaginary component with a particular relationship to the real component, combining the first and second signals to produce a third signal for introduction to the crystal with the real and imaginary components, operating upon the third signal to provide the first signal.

28. A method as set forth in claim 27, including the steps of:

regulating the gain of the first signal at a particular value to maintain the oscillations of the crystal at the particular frequency.

29. A method as set forth in claim 27, including the step of:

adjusting the amplitude of the second signal to produce adjustments in the frequency of oscillations of the crystal.

30. A method as set forth in claim 26 wherein the step of operating upon the third signal to produce the first signal includes the steps of producing from the third signal a first current having characteristics corresponding to the characteristics of the third signal and producing a second current with the imaginary components from the third signal and combining the first and second currents to produce a current with the real component.

31. A method as set forth in claim 27 wherein the first signal is in the form of current and wherein the second signal is in the form of a current and wherein the third signal is in the form of a voltage.

32. A method of providing oscillations at a particular frequency, including the steps of:

providing a crystal resonant at substantially the particular frequency, providing a first signal having a real component, providing from the first signal a second signal having an imaginary component with a particular relationship to the real component, combining the first and second signals to produce a third signal for introduction to the crystal with the real and imaginary components, operating upon the third signal to provide the first signal, and regulating the gain of the first signal at a particular value to maintain the oscillations of the crystal at the particular frequency.

33. A method as set forth in claim 32 wherein the first and second signals are currents and the third signal is a voltage.

34. A method as set forth in claim 32 wherein the particular phase relationship between the first and second signals is 90° and the second signal lags the first signal by 90°.

35. A method as set forth in claim 32 including the steps of introducing the second signal to a capacitor connected in parallel with the crystal.

36. A method as set forth in claim 33 wherein a voltage corresponding to the second current is introduced to a capacitor in parallel with the crystal.

\* \* \* \* \*